United States Patent [19]

Coyle

[11] 3,960,777

[45] June 1, 1976

[54] GOLD COMPOSITIONS

[75] Inventor: Roy Thomas Coyle, Wilmington, Del.

[73] Assignee: E. I. Du Pont de Nemours and Company, Wilmington, Del.

[22] Filed: June 23, 1975

[21] Appl. No.: 589,548

[52] U.S. Cl.................................. 252/514; 106/1
[51] Int. Cl.².......................................... H01B 1/02
[58] Field of Search....................... 252/514; 106/1

[56] References Cited
UNITED STATES PATENTS

| | | | |
|---|---|---|---|
| 3,293,501 | 12/1966 | Martin | 106/1 X |
| 3,350,341 | 10/1967 | Short | 260/42.22 X |
| 3,450,545 | 6/1969 | Ballard et al. | 106/1 |
| 3,776,769 | 12/1973 | Buck | 252/514 X |
| 3,799,890 | 3/1974 | Smith | 252/514 |
| 3,799,891 | 3/1974 | Smith | 106/1 X |

Primary Examiner—Benjamin R. Padgett
Assistant Examiner—E. Suzanne Parr

[57] ABSTRACT

This invention relates to compositions which are dispersions of certain proportions of gold and inorganic binder in an inert liquid vehicle, useful in the electronics art for producing conductor patterns adherent to substrates. Even small amounts of the binder are effective in obtaining excellent adhesion to ceramic substrates. The binder comprises, by weight, (a) 4–23% CuO, (b) 13–36% of CdO or mixtures thereof with CaO, there being at least 13% CdO in the binder, (c) 30–60% $B_2O_3$, $SiO_2$, $P_2O_5$, $V_2O_5$, $Al_2O_3$, and/or $GeO_2$, provided that at least 5% $B_2O_3$, $SiO_2$, $P_2O_5$, and/or $V_2O_5$ is present in the binder, and (d) 0–20% PbO, and/or $Bi_2O_3$. The amount of binder in the compositions is related to the amount of CuO in the binder as set forth herein. Optionally certain amounts of crystalline fluxes ($PbF_2$ and/or LiF) may be present.

9 Claims, 1 Drawing Figure

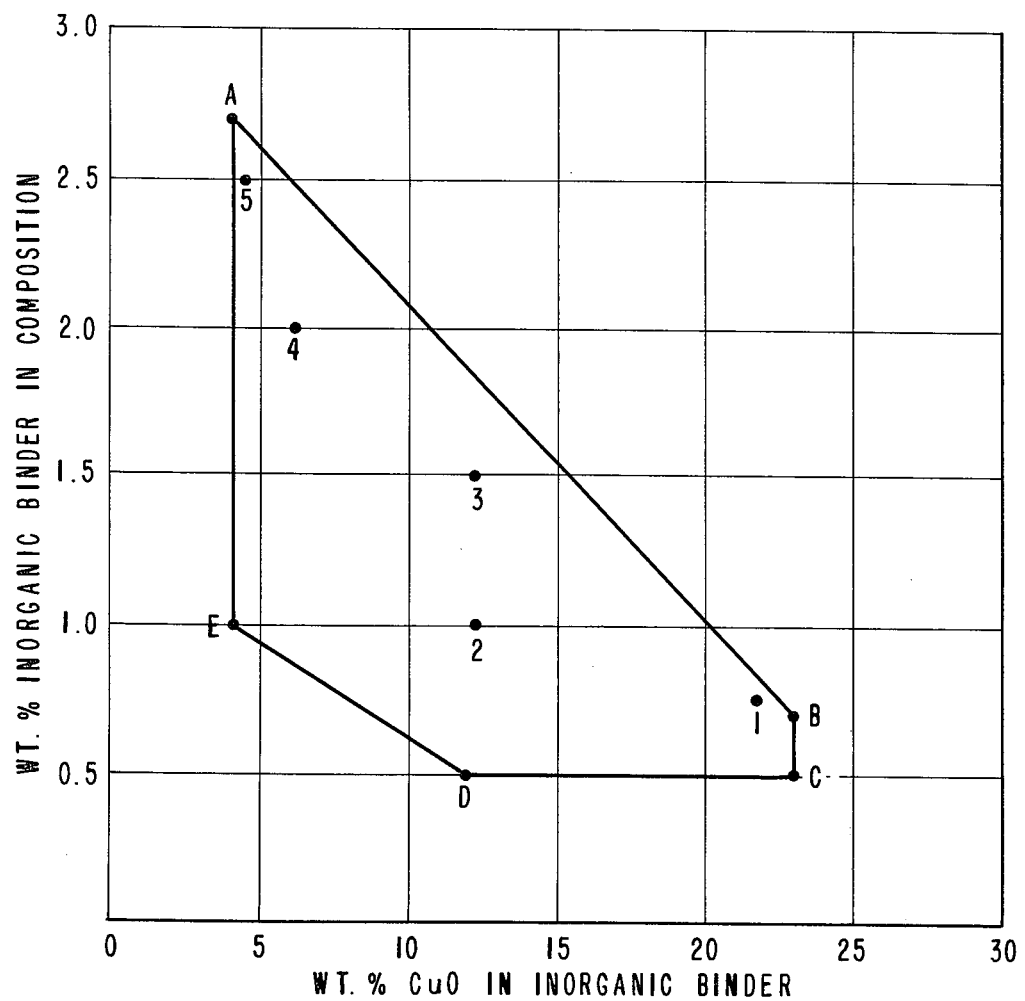

3,960,777

GOLD COMPOSITIONS

BACKGROUND OF THE INVENTION

This invention relates to electronics, and more particularly to noble metal compositions useful for producing conductor patterns adherent to substrates.

Conductor compositions which are applied to and fired on ceramic dielectric substrates usually comprise finely divided noble metal particles and inorganic binder particles, and are commonly applied to substrates using so-called "thick film" techniques, as a dispersion of inorganic powders in an inert liquid medium or vehicle. The metallic component of the composition provides the functional (conductive) utility, while the inorganic binder (e.g., glass, $Bi_2O_3$, etc.) bonds the metal particles to one another and to the substrate. Thick film techniques are contrasted with "thin film" techniques, which involve deposition of particles by evaporation or sputtering. Thick film techniques are discussed generally in "Handbook of Materials and Processes for Electronics," C. A. Harper, Editor, McGraw-Hill, N.Y., 1970, Chapter 12.

Conductor compositions of noble metal powders and glass binders are disclosed in, e.g., Ballard et al. U.S. Pat. No. 3,450,545, which relates to compositions of noble metal, glass, and an additive from among the oxides of Rh, Ir, Ru, Cu, and Si, or silicon carbide or boron nitride. Martin U.S. Pat. No. 3,293,501 discloses the manufacture of conductive films of noble metals plus copper glasses, and discloses only glasses of high bismuth content. Buck U.S. Pat. No. 3,776,769 discloses conductor compositions, which are fired in reducing atmospheres, of noble metal, 1–50% copper or its oxide(s), and vitreous binder. The necessity of firing in an atmosphere other than air is a distinct commercial drawback.

Noble metal conductor compositions employing a glass-free binder are disclosed in White U.K. Patent No. 855,625, relating to the use of compositions of, e.g., silver plus copper oxide plus a minor proportion of a third "inert" material capable of being wetted by molten silver and copper oxide, which may be printed and fired on ceramic substrates. The inert material may be alumina, magnesia, zirconia, titania, chromic oxide, or alumina-silicate. The firing temperatures are above 940°C., preferably between 1000°–1100°C. No inert material which melts at the firing temperature is suggested.

Glass-free gold conductor compositions having relatively high and/or narrow firing ranges are Smith U.S. Pat. Nos. 3,799,890 and 3,799,891, isued on Mar. 26, 1974, related to glass-free compositions of gold, vehicle, copper oxide, and, in U.S. Pat. No. 3,799,891, CdO. Gold/copper oxide compositions were disclosed by Gucker et al. in Am. Ceram. Soc. Bull. 46, 789 (1967).

Short U.S. Pat. No. 3,350,341 discloses silver compositions comprising a $PbF_2$-containing glass.

There is a distinct need in the electronics art for gold conductor compositions which use small quantities of binder than do compositions with conventional glass binders, yet achieve good adhesion to the substrate. It is desirable that the compositions achieve good adhesion at firing temperatures lower than those required by the compositions of Smith U.S. Pat. Nos. 3,799,890 and 3,799,891. Further, it is desirable that the fired conductor patterns be thermal compression bondable without the necessity of a chemical precleaning step.

SUMMARY OF THE INVENTION

This invention provides gold compositions which can produce fired conductor patterns using small amounts of binder, yet can be thermal compression bonded without a chemical precleaning step, unlike other copper-based binders (which tend to tarnish). The compositions comprise finely divided gold particles and inorganic binder particles dispersed in an inert liquid vehicle. The inorganic binder is a glassy material of, by weight, a. 4–23% CuO,
b. 13–36% CdO or mixtures thereof with CaO, there being at least 13% CdO in the binder,
c. 30–60% of one or more of $B_2O_3$, $SiO_2$, $P_2O_5$, $V_2O_5$, $Al_2O_3$, and $GeO_2$, provided that said binder comprises at least 5% of one or more of $B_2O_3$, $SiO_2$, $P_2O_5$, and $GeO_2$, and
d. 0–20% of one or more of PbO and $Bi_2O_3$.

Component (c) of the binder preferably comprises 40–100%, by weight, of $B_2O_3$ and/or $SiO_2$, based on the total weight of component (c).

The compositions comprise, by weight, 85–92% gold, 0.5–2.7% inorganic binder, and 7–14% vehicle. The weight of inorganic binder in the composition is related to the composition of the particular binder used. Specifically, the percentage binder in the composition and the percentage CuO in the binder are chosen together from a point within the area defined by the straight lines connecting points A, B, C, D, and E in the drawing. This relationship, it has been discovered, can produce sintered (fired) conductors with good adhesion (2.0 Kg. or more) plus good T.C. bonding at 250°C., without requiring precleaning of the fired conductor pattern.

More preferred proportions of components (a)–(d) in the binder are:

5–15% (a),
20–30% (b),
40–50% (c), and
10–20% (d).

Most preferred compositions are those wherein the binder is a. 12–13% CuO
b. 17–19% CdO and 8–9% CaO,
c. 13–14% $B_2O_3$, 13–14% $SiO_2$, 6–8% $Al_2O_3$, and 11–13% $P_2O_5$, and
d. 14–16% PbO.

The compositions may additionally comprise a crystalline flux which is $PbF_2$, LiF, or mixtures thereof. The weight of the flux is 0–100%, preferably 25–100%, of the weight of the inorganic binder. The flux is introduced into the composition at the expense of other components of the composition; hence, when the binder is 1% of the composition, and the flux equals the binder, there are 100, not 101, parts of composition. The flux is preferably $PbF_2$.

BRIEF REFERENCE TO THE DRAWING

The drawing is a graph showing the relationship between the percentage binder in the compositions of the present invention and the percentage CuO in the binder itself. Points 1 through 5 correspond to that relationship in the compositions of Examples 1–5, respectively.

DETAILED DESCRIPTION OF THE INVENTION

The compositions of the present invention comprise finely divided gold and inorganic binder dispersed in a vehicle, which is an inert liquid. The inorganic binder upon printing and firing is responsible for adhesion of the sintered metal to dielectric substrates.

The binder is prepared by conventional glass-making techniques, by mixing the desired components (or precursors thereof, e.g., $H_3BO_3$ for $B_2O_3$) in the desired proportions and heating the mixture to form a melt. As is well known in the art, heating is conducted to a peak temperature and for a time such that the melt becomes entirely liquid, yet no gaseous evolution is observed. In this work the peak temperature is in the range 1050°–1300°C. The melt is then fritted (particles are made) by cooling the melt, typically by pouring onto a cold belt or into cold running water. Particle size reduction can then be accomplished by milling as desired.

In the binders of the present invention there is 4–23%, preferably 5–15%, most preferably 12–13% CuO, referred to as component (a) above. CuO was used as the basis for calculation, since it is assumed that even if cuprous oxide ($Cu_2O$) or its salts (e.g., the carbonate) were added to the glass-forming batch, cupric oxide (CuO) would be the predominant or sole oxide formed. In any event, the presence of some cuprous oxide would not significantly affect the weight calculations herein, since 2 moles of cupric oxide weigh 179 grams, while one mole of cuprous oxide weighs 143 grams.

Component (b) of the binder is 13–36%, preferably 20–30%, of CdO and mixtures thereof with CaO. At least 13% of the binder is CdO. Most preferably there is 17–19% CdO and 8–9% CaO.

Components (a) and (b), it is thought, are largely responsible for adhesion of the fired compositions to the substrate.

At least 30% of the binder, preferably at least 40%, is component (c), one or more oxides from among $B_2O_3$, $SiO_2$, $P_2O_5$, $V_2O_5$, $Al_2O_3$, and $GeO_2$, provided that at least 5% of the binder is $B_2O_3$, $SiO_2$, $P_2O_5$, and/or $GeO_2$. Component (c) is present to provide glassiness, and, it is thought, to provide flexibility in the range of firing temperatures which can be used herein to achieve good substrate adhesion. No more than 60% of component (c) is present in the binder, so that adequate amounts of components (a) and (b) are present to achieve good adhesion to the substrate. In terms of the composition of component (c) itself, optimum compositions are those wherein 40–100% of the weight of component (c) is $B_2O_3$, $SiO_2$, or mixtures thereof. In one optimum binder there is 13–14% $B_2O_3$, 13–14% $SiO_2$, 6–8 % $Al_2O_3$, and 11–13% $P_2O_5$.

It is thought that the glassy nature of the binders of the present invention is responsible to some extent for the fact that at least some of the compositions of the present invention can be fired at temperatures below those needed in the case of the glass-free binders of Smith U.S. Pat. Nos. 3,788,890 and 3,799,891.

Component (d) of the binder is 0–20%, preferably 10–20%, of PbO and/or $Bi_2O_3$. PbO is the preferred additive, its optimum amount being 14–16%. It is thought that these optional oxides contribute to adhesion to the substrate where they are present in limited amounts; however, larger amounts of these optional additives tend to reduce adhesion.

The crystalline fluxes $PbF_2$ and LiF may be added to further enhance success of T.C. bonding. Of course, the flux is optional but if present, its weight should not exceed the weight of the inorganic binder. Preferably, the amount of flux is 25–100% of the weight of the binder.

The inorganic particles used in the compositions of this invention (gold powder, inorganic binder powder, and flux) are usually described as finely divided powders, and are generally sufficiently finely divided to pass through a 200-mesh screen, preferably a 400-mesh screen (U.S. standard sieve scale). Typically substantially all of the particles have dimensions in the range 0.01–10 microns, preferably 0.1–10 microns, more preferably 0.1–5 microns.

The inorganic particles are mixed with an inert liquid vehicle by mechanical mixing (e.g., on a roll mill) to form a paste-like composition. The latter is printed as thick film on conventional ceramic dielectric substrates (such as alumina) in the conventional manner. Any inert liquid may be used as the vehicle, such as water or any one of various organic liquids, with or without thickening and/or stabilizing agents and/or other common additives. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate.

The ratio of inert liquid vehicle to inorganic powders in the dispersions depends upon the manner in which the dispersion is to be applied and the kind of vehicle used. In printing gold compositions with small amounts of inorganic binder it is often preferred to have a very high gold content in the composition to maximize coverage and film density. Hence, while broad proportions of solids to vehicle can be used to take advantage of the improved properties achieved with the inorganic materials of this invention, preferred compositions comprise the proportions of noble metal, binder, and vehicle set forth in the Summary of the Invention above. The compositions of the present invention may, of course, be modified by the addition of other materials which do not affect its beneficial characteristics. Furthermore, larger amounts of binder may be employed at the sacrifice of certain electrical properties.

After drying to remove the inert vehicle, firing of the compositions of the present invention is carried out at temperatures and for times sufficient to sinter the inorganic materials and to produce conductor patterns adherent to the dielectric substrate. Depending upon the properties desired and composition used, peak firing temperatures are generally in the range 850°–1000°C. for durations less than 0.5 hour, and preferably for 5–20 minutes.

EXAMPLES

The following examples are presented to illustrate the invention. In the examples and throughout the specification and claims all percentages, proportions, ratios, etc., are by weight unless otherwise specifically stated.

Compositions of the present invention were made using a vehicle of 8% ethyl cellulose, 3.4% rosin, 27% butyl carbitol acetate, 15% terpineol, 15% Magee Oil aliphatic alcohol, 25% 2,2,4-trimethylpentanediol-1,3-monoisobutyrate, 2.4% dibutyl phthalate, 2.6% acrylate terpolymer suspension, and 1.6% Baker Castor Oil Co. Thixatrol ST hydrogenated castor oil. The binders used are set forth in Table 1. Each binder was prepared by mixing the appropriate oxides or precursors thereof (e.g., $H_3BO_3$ for $B_2O_3$) in proportions so as to achieve the desired final oxide proportions. Each glass precursor batch was melted to a temperature in the range 1050°–1300°C., depending upon the precursors used and their proportions, until fluid and no gaseous evolution was occurring. The melt was poured into cold running water to form a frit, then milled to a finely divided powder.

In each inorganic material used (gold, binder, and flux) substantially all the particles were greater than 0.1 micron and less than 5 microns in diameter. The binder had a surface area of 1.5 m.$^2$/g. In each example binder, gold, vehicle, and flux (if any) were mixed on a roll mill. The resultant pasty composition was printed through a 200-mesh screen (U.S. standard sieve scale) on a dense (prefired) 99.5% alumina substrate. The screen had nine openings 0.08 inch (0.02 cm.) square aligned in a three-by-three matrix. The printed substrate was dried at 120°C. for 10 min. to produce a dry print about 30 microns thick. The printed substrate was then fired as indicated in the examples to produce conductor pads having a fired thickness of about 18 microns.

TABLE 1

COMPOSITION OF INORGANIC BINDERS

| Component | Binder No. (wt. %) | | | |
|---|---|---|---|---|
| | V | W | X | Y |
| CuO | 35.6 | 21.7 | 12.2 | 0 |
| CdO | 13.2 | 16.1 | 18.0 | 20.5 |
| CaO | 6.2 | 7.5 | 8.4 | 9.6 |
| $B_2O_3$ | 10.2 | 12.4 | 13.9 | 15.8 |
| $SiO_2$ | 10.2 | 12.4 | 13.9 | 15.8 |
| $Al_2O_3$ | 5.1 | 6.1 | 6.9 | 7.8 |
| $P_2O_5$ | 8.9 | 10.8 | 12.1 | 13.7 |
| PbO | 10.8 | 13.1 | 14.7 | 16.7 |

Adhesion to the substrate of fired samples was determined as follows. Wire leads were attached to the pads by placing a 20-gauge (0.08 cm. diameter) pretinned copper wire across three of the pads, fluxing with an organic chloride flux (Incoa stainless steel flux), and dipping into a solder pot of 12 In/70 Sn/18 Pb at about 212°C. Adhesion strengths were then determined by pulling the soldered leads with a Chatillion strength tester. Results are reported in the tables. (Pad adhesion is usually higher than that reported, since most failures occurred in the solder.) Adhesion data were obtained in certain examples (Examples 1–8) after the wire-bonded samples had been thermal cycled ten times (−196°C. for 10 seconds to +100°C. for 15 seconds in each cycle).

Thermal compression (T.C.) bonding characteristics were determined on the fired samples, without any chemical precleaning of the samples. A Kulicke and Soffa Model 478 T.C. wire bonder was used with a 1-mil gold wire and a bonding temperature of 250°C. The two bonding modes employed 60 g. pressure (ball bonding) and 120 g. pressure (stitch bonding). In most cases 20 bonds were attempted. The tables report the percentage of attempted bonds which were successful.

EXAMPLES 1–5

Comparative Showings A–G

The compositions specified in Table 2 were fired in a belt furnace over a 1-hour cycle with 8 min. at a peak temperature of 925°C., then reheated for 3 more similar cycles each using a peak temperature of 850°C. Finally, the samples were heated for 30 min. at 525°C. in a box furnace.

Binder V in Showings A and B produced acceptable adhesion but very poor T.C. bonding. Binder V is not of this invention due to its high CuO content (35.6%).

In Example 1, 0.75% binder W produced excellent adhesion and T.C. bonding (Binder W is of this invention, 22% CuO). In Showings C and D, however, the same binder produces good adhesion, but no T.C. bonding at levels of 1.0% and 2.0% in the composition.

Binder X (12% CuO) produced the best adhesion and excellent T.C. bonding at 1.0% and 1.5% of the composition in Examples 2 and 3, but no T.C. bonding at 2.0% and 4.0% of the composition in Showings E and F.

Binders X and Y were mixed in equal amounts in Example 4 to produce a binder of 6.1% CuO. At 2.0% binder, excellent adhesion and T.C. bonding occurred.

TABLE 2

| Example (No.)/ Showing (Letter) | Gold | Vehicle | Composition (Wt. %) Binder of Table 1 | | | | Peel Strength (Kg.) | 250°C. T.C. Bonding (Percent Successful bonds) |
|---|---|---|---|---|---|---|---|---|
| | | | V | W | X | Y | | |
| A | 88 | 11.5 | 0.5 | — | — | — | >2.5 | 50 |
| B | 88 | 11.25 | 0.75 | — | — | — | >3.0 | 20 |
| 1 | 88 | 11.25 | — | 0.75 | — | — | >2.5 | 100 |
| C | 88 | 11.0 | — | 1.0 | — | — | >2.7 | 0 |
| D | 88 | 10.0 | — | 2.0 | — | — | >2.4 | 0 |
| 2 | 88 | 11.0 | — | — | 1.0 | — | >3.0 | 100 |
| 3 | 88 | 10.5 | — | — | 1.5 | — | >3.5 | 100 |
| E | 87 | 11.0 | — | — | 2.0 | — | >2.5 | 0 |
| F | 86 | 10.0 | — | — | 4.0 | — | >1.9 | 0 |
| 4 | 87 | 11.0 | — | — | 1.0 | 1.0 | >2.6 | 100 |
| 5 | 87 | 10.5 | — | 0.5 | — | 2.0 | >2.5 | 100 |
| G | 87 | 11.0 | — | — | — | 2.0 | 0.3 | 100 |

In Example 5 Binders W and Y were mixed to produce a binder of 5.4% CuO. Excellent adhesion and T.C. bonding occurred at 2.5% glass in the composition.

Showing G illustrates the need for CuO in the binder to produce adequate adhesion. A binder containing no CuO (Glass Y) produced good T.C. bonding, but poor adhesion.

EXAMPLES 6-8

Several compositions were made using a flux. The compositions are set forth in Table 3. The binder contained 12.2% CuO. The compositions were fired in a belt furnace over a 1-hour cycle at the temperature indicated in Table 3 (8 min. at peak), and then each was similarly refired three times (850°C. peak each time).

Table 3

| | Example No. | | |
|---|---|---|---|
| | 6 | 7 | 8 |
| Composition (wt. %) | | | |
| gold | 87 | 86 | 86 |
| vehicle | 11 | 11.5 | 11.5 |
| binder X of Table 1 | 1 | 1.5 | 1.5 |
| $PbF_2$ flux | 1 | 1.0 | — |
| LiF flux | — | — | 1.0 |
| Peel Strength (Kg.) | | | |
| after firing at: | | | |
| 925°C. | >2.5 | — | — |
| 850°C. | 1.4 | >2.7 | >2.2 |
| T.C. Bonding, 250°C., | | | |
| % successful bonds on | | | |
| samples fired at: | | | |
| 925°C. | 100 | — | — |
| 850°C. | 100 | 100 | 100 |

I claim:

1. In a composition of finely divided gold particles and finely divided inorganic binder particles dispersed in an inert liquid vehicle, improved compositions of, by weight, 85–92% gold particles, 0.5–2.7% inorganic binder particles, and 7–14% vehicle; the inorganic binder being
    a. 4–23% CuO
    b. 13–36% CdO or mixtures thereof with CaO, provided that at least 13% of the binder is CdO,
    c. 30–60% of one or more of $B_2O_3$, $SiO_2$, $P_2O_5$, $V_2O_5$, $Al_2O_3$, and $GeO_2$, provided that said binder comprises at least 5% of one or more of $B_2O_3$, $SiO_2$, $P_2O_5$, and $GeO_2$, and
    d. 0–20% of one or more of PbO and $Bi_2O_3$;
said compositions being further characterized in that the weight percentage of CuO in said inorganic binder and the weight percentage of inorganic binder present in the total composition are chosen together from a point which lies within the straight lines connecting points A, B, C, D, and E in the graph of the drawing.

2. Compositions according to claim 1 wherein component (c) of said binder comprises 40–100% by weight, based on the total weight of component (c), of $B_2O_3$, $SiO_2$, or mixture thereof.

3. Compositions according to claim 1 wherein said binder comprises
    a. 5–15% CuO
    b. 20–30% of CdO or mixtures thereof with CaO,
    c. 40–50% of one or more of $B_2O_3$, $SiO_2$, $P_2O_5$, $V_2O_5$, $Al_2O_3$, and $GeO_2$, provided that 40–100% of the total weight of component (c) is $B_2O_3$, $SiO_2$, or mixtures thereof,
    d. 10–20% of one or more of PbO and $Bi_2O_3$.

4. Compositions according to claim 3 wherein said binder comprises
    a. 12–13% CuO
    b. 17–19% CdO and 8–9% CaO,
    c. 13–14% $B_2O_3$, 13–14% $SiO_2$, 6–8% $Al_2O_3$, and 11–13% $P_2O_5$, and
    d. 14–16% PbO.

5. Compositions according to claim 1 additionally comprising a crystalline flux which is one or more of $PbF_2$ and LiF, in an amount equal to 25–100% of the weight of said binder.

6. Compositions according to claim 2 additionally comprising a crystalline flux which is one or more of $PbF_2$ and LiF, in an amount equal to 25–100% of the weight of said binder.

7. Compositions according to claim 3 additionally comprising a crystalline flux which is one or more of $PbF_2$ and LiF, in an amount equal to 25–100% of the weight of said binder.

8. Compositions according to claim 4 additionally comprising a crystalline flux which is one or more of $PbF_2$ and LiF, in an amount equal to 25–100% of the weight of said binder.

9. Compositions according to claim 5 wherein said crystalline flux is $PbF_2$.

* * * * *